(12) United States Patent
Choi et al.

(10) Patent No.: US 7,888,857 B2
(45) Date of Patent: Feb. 15, 2011

(54) LIGHT EMITTING DEVICE WITH THREE-DIMENSIONAL STRUCTURE AND FABRICATION METHOD THEREOF

(75) Inventors: Jae Young Choi, Suwon-si (KR); Byoung Lyong Choi, Seoul (KR); Dong Kee Yi, Seoul (KR); Kwang Soo Seol, Gyeonggi-do (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 989 days.

(21) Appl. No.: 11/534,710

(22) Filed: Sep. 25, 2006

(65) Prior Publication Data
US 2007/0138460 A1  Jun. 21, 2007

(30) Foreign Application Priority Data
Dec. 19, 2005 (KR) ............... 10-2005-0125765

(51) Int. Cl.
*H01J 63/04* (2006.01)
*H01J 1/62* (2006.01)

(52) U.S. Cl. ............... 313/503; 313/504; 313/505; 313/506; 313/483; 313/498; 313/499; 257/13

(58) Field of Classification Search ............... None
See application file for complete search history.

(56) References Cited

U.S. PATENT DOCUMENTS 6,476,550 B1 * 11/2002 Oda et al. ............... 313/504
6,515,314 B1 * 2/2003 Duggal et al. ............... 257/184
6,630,684 B2 * 10/2003 Lee et al. ............... 257/40
7,173,276 B2 * 2/2007 Choi et al. ............... 257/40
7,609,929 B2 * 10/2009 Seol et al. ............... 385/125
2002/0086180 A1 * 7/2002 Seo et al. ............... 428/690
2003/0057417 A1   3/2003 Lee et al.
2005/0069726 A1 * 3/2005 Douglas et al. ............... 428/690

FOREIGN PATENT DOCUMENTS

KR   1020050025919   3/2005

* cited by examiner

*Primary Examiner*—Nimeshkumar D Patel
*Assistant Examiner*—Natalie K Walford
(74) *Attorney, Agent, or Firm*—Cantor Colburn LLP (57) ABSTRACT

A three-dimensional light emitting device and a method for fabricating the light emitting device are provided. The light emitting device comprises a substrate and a semiconductor nanoparticle layer wherein the substrate is provided with a plurality of three-dimensional recesses and the surface having the recesses is coated with semiconductor nanoparticles. According to the three-dimensional light emitting device, the formation of the semiconductor nanoparticles on the surface of the recessed substrate increases the light emitting area and enhances the luminescence intensity, leading to an increase in the amount of light emitted from the light emitting device per unit area. Therefore, the three-dimensional light emitting device has the advantage of improved luminescence efficiency.

13 Claims, 4 Drawing Sheets

LIGHT EMITTING DEVICE WITH THREE-DIMENSIONAL STRUCTURE AND FABRICATION METHOD THEREOF

This application claims priority to Korean Patent Application No. 10-2005-0125765, filed on Dec. 19, 2005, and all the benefits accruing therefrom under 35 U.S.C. §119(a) which is incorporated herein in its entirety by reference.

BACKGROUND OF THE INVENTION

1. Field of the Invention

The present invention relates to a light emitting device with a three-dimensional structure (hereinafter, referred to simply as a "three-dimensional light emitting device") using semiconductor nanoparticles and a method for fabricating the light emitting device. More specifically, the present invention relates to a three-dimensional light emitting device with improved luminescence efficiency wherein a substrate is provided with three-dimensional recesses and the entire surface of the recesses is coated with semiconductor nanoparticles, and a method for fabricating the light emitting device.

2. Description of the Related Art

With the recent advances in digital communication technologies, there has been increasing demand for highly functional and efficient photonic products. Since the 1990's, great efforts have been directed toward the development of light emitting devices using semiconductors.

In light emitting devices using semiconductors, when an electric current is applied to a p-type semiconductor and an n-type semiconductor joined to each other, electrons of the n-type semiconductor present in a conduction band of the energy bands recombine with holes of the p-type semiconductor present in a valence band of the energy bands to release energy corresponding to the energy gap between the valence and conduction bands in the form of light.

Generally, quantum confinement effects are utilized in light-emitting layers of light emitting devices to enhance the luminescence efficiency of the light emitting devices. That is, electrons and holes of the conduction band are confined in an active layer of a quantum well structure, and as a result, the state density of the carriers in the quantum well is increased, thus leading to an effective increase in the luminescence recombination efficiency of the electrons and the holes. In addition, since the refractive index of the quantum well is larger than that of a semiconductor material surrounding the quantum well, photons generated in the quantum well are also spatially confined in the vicinity of the quantum well. Light emitting devices can be used in a wide variety of photonic products, including displays (e.g., flat panel displays), screens (e.g., computer screens) and medical devices requiring irradiation. Accordingly, high luminance, low operation voltage, and high efficiency of light emitting devices are important factors in determining the quality of the photonic products.

In recent years, a number of studies on quantum dot displays have been undertaken in view of high luminescence efficiency. Quantum dot displays are devices wherein semiconductor rods having a size on the order of several nanometers are formed and light emission is achieved by tunneling effects. The advantage of quantum dot displays is that light emitting diodes ("LEDs") having a size of several nanometers are densely distributed to emit light, thus achieving markedly improved luminescence efficiency.

Figure 1:
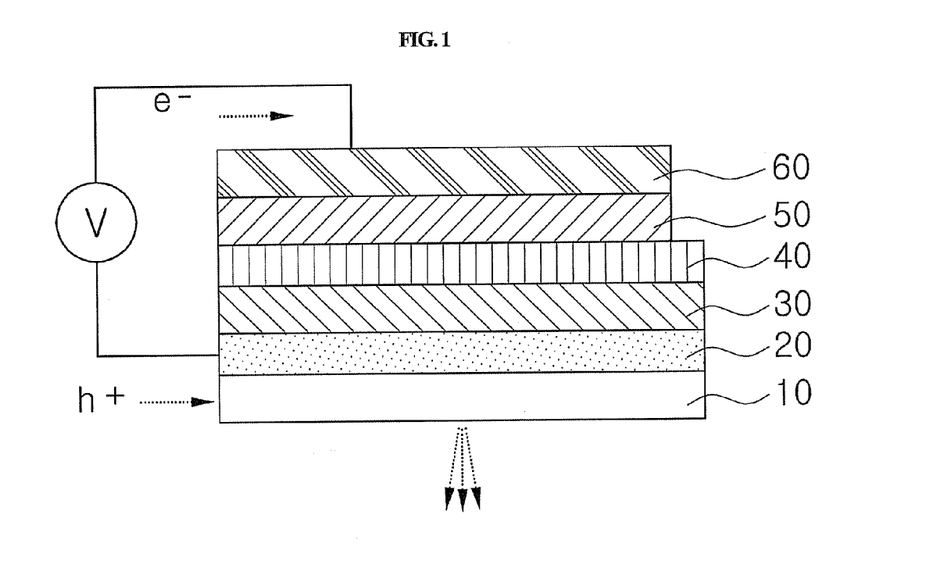
FIG. 1 is a schematic cross-sectional view of an exemplary conventional light emitting device with a planar structure using semiconductor nanoparticles.

FIG. 1 is a schematic cross-sectional view of a conventional quantum dot light emitting device as an organic electroluminescence device. As shown in FIG. 1, the conventional quantum dot light emitting device comprises a substrate 10, a pair of electrodes 20 and 60 formed over the substrate 10, a semiconductor nanoparticle layer 40 interposed between the electrodes 20 and 60, and a hole transport layer 30 and an electron transport layer 50 formed on the upper and lower surfaces of the semiconductor nanoparticle layer 40, respectively. Most light emitting devices that are currently in use have a structure in which constituent elements thereof, such as electrodes and light-emitting layers, are evenly formed. In such light emitting devices with a planar structure, however, a large proportion of light generated from the light-emitting layer is totally reflected from the surface of a substrate or electrodes and is confined in the devices, thus causing a decrease in the amount of light emitted from the devices.

To solve the problem, attempts have been made to develop structures capable of releasing light generated from a light-emitting layer to the outside without any loss of the light. For example, U.S. Patent Application Publication No. 2003/0057417 discloses an organic light emitting device in which a photonic crystal concavo-convex structure is formed in a transparent substrate to generate a leaky wave, thereby increasing the light extraction efficiency. According to the light emitting device, however, loss of the internally generated light is reduced but there is a limit to the increase in the internal light. In addition, another limitation of the light emitting device is that it is difficult to form the photonic crystal structure in a large area, in an economical manner.

Further, Korean Laid-open Patent No. 2005-0025919 ("the '919 Patent") discloses a high-luminance organic light emitting device having a structure in which a plurality of hemispherical concave portions, particularly nanometer-sized hemispherical concave portions, are continually formed in a substrate and/or electrodes. According to the organic light emitting device, since the shape of the concave portions is limited to hemispheres, methods for forming the concave portions are limited. In addition, a drawback associated with the formation of the concave portions by oxidation of Al, which are suggested in the '919 patent, is that it is difficult to control the shape of the concave portions.

Further, Japanese Unexamined Patent Publication No. 2004-87615 discloses a method for manufacturing a semiconductor laser comprising forming a semiconductor layer on a substrate, forming regular grooves on the semiconductor layer, and aligning quantum dots on the bottoms of the grooves in a three-dimensional direction to form a light-emitting layer. According to this method, however, since the quantum dots are formed on the bottoms of the grooves by a vapor deposition process, such as molecular beam epitaxy, the use of expensive equipment is required, incurring considerable manufacturing costs.

BRIEF SUMMARY OF THE INVENTION

Therefore, the present invention has been made in view of the above problems of the prior art, and provides a three-dimensional light emitting device with improved luminescence efficiency that is fabricated using semiconductor nanoparticles at reduced costs.

Also provided is a method for fabricating a three-dimensional light emitting device using semiconductor nanoparticles in a simple and economical manner.

In accordance with one embodiment of the present invention, there is provided a light emitting device comprising a substrate and a semiconductor nanoparticle layer on the substrate wherein the substrate is provided with a plurality of three-dimensional recesses, and the surface of the recesses is coated with semiconductor nanoparticles to form the semiconductor nanoparticle layer.

The recesses of the semiconductor nanoparticle layer may have any structure including polygonal pillars, cylinders, tubes, or a combination comprising at least one of the foregoing shapes. The semiconductor nanoparticle layer may be formed into a monolayer or multilayer structure.

The three-dimensional light emitting device of the present invention may be an organic electroluminescence device or photoluminescence device. Specifically, the light emitting device may be an electroluminescence device comprising a first electrode, an electron transport layer in electrical contact with the first electrode, a semiconductor nanoparticle layer on a surface of the electron transport layer, a hole transport layer on a surface of the semiconductor nanoparticle layer opposite the electron transport layer, and a second electrode on and in electrical contact with the hole transport layer, where the layers are formed on a substrate wherein the substrate is provided with a plurality of recesses. In the electroluminescence device, the first electrode, the electron transport layer, the semiconductor nanoparticle layer, the hole transport layer and the second electrode can be sequentially deposited on the substrate while maintaining the recessed structure of the substrate.

The light emitting device of the present invention may be a photoluminescence device comprising a substrate and a semiconductor nanoparticle layer formed on a light source wherein the substrate is provided with a plurality of recesses. In the photoluminescence device, the semiconductor nanoparticle layer can be formed on the substrate while maintaining the recessed structure of the substrate.

In accordance with another embodiment of the present invention, there is provided a method for fabricating a three-dimensional light emitting device comprising a semiconductor nanoparticle layer, the method comprising:

preparing a dispersion of semiconductor nanoparticles whose surface is modified to be charged;

forming three-dimensional recesses in a substrate;

pretreating the substrate so that the substrate has the opposite charge of the surface of the semiconductor nanoparticles; and coating the dispersion of the semiconductor nanoparticles on the pretreated substrate, wherein the surfaces of the semiconductor nanoparticles and the substrate are treated to have opposite charges.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

The present invention will now be described in greater detail with reference to the accompanying drawings.

It will be understood in the following disclosure of the present invention, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (i.e., in at least partial contact with) the other element (s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A three-dimensional light emitting device is provided, comprising a substrate provided with a plurality of three-dimensional recesses and a semiconductor nanoparticle layer formed on the substrate while maintaining the recessed structure of the substrate.

The section of the recesses may have various shapes, such as squares, triangles, polygons, circles and ellipsoids, or a combination comprising at least one of the foregoing shapes. The inner side walls of the recesses may be tapered or rounded to have wave shapes.

Since the plurality of recesses are regularly spaced in the light emitting device, they may have various planar patterns, such as square lattice patterns, triangular lattice patterns, polygonal lattice patterns, circular lattice patterns and elliptical lattice patterns, or a combination comprising at least one of the foregoing lattice patterns.

The entire surface of the bottoms and sidewalls of the recessed substrate is coated with semiconductor nanoparticles so that the light emitting area of the semiconductor nanoparticle layer is increased. In actuality, a semiconductor nanoparticle layer formed on a substrate having recesses may have a four to ten fold larger light emitting area than a semiconductor nanoparticle layer formed on a flat substrate having the same area as that of the recessed substrate. By varying the shape of the recesses, e.g., by controlling the depth of the recesses, the light emitting area of the semiconductor nanoparticle layer can be extended. Amplification resulting from resonance occurs within the recesses depending on the type of a light source so that the luminescence intensity can be additionally enhanced.

The light emitting device disclosed herein can be applied to all kinds of light emitting devices comprising a semiconductor nanoparticle layer. For example, the light emitting device may be an organic electroluminescence device or photoluminescence device.

Figure 2A:
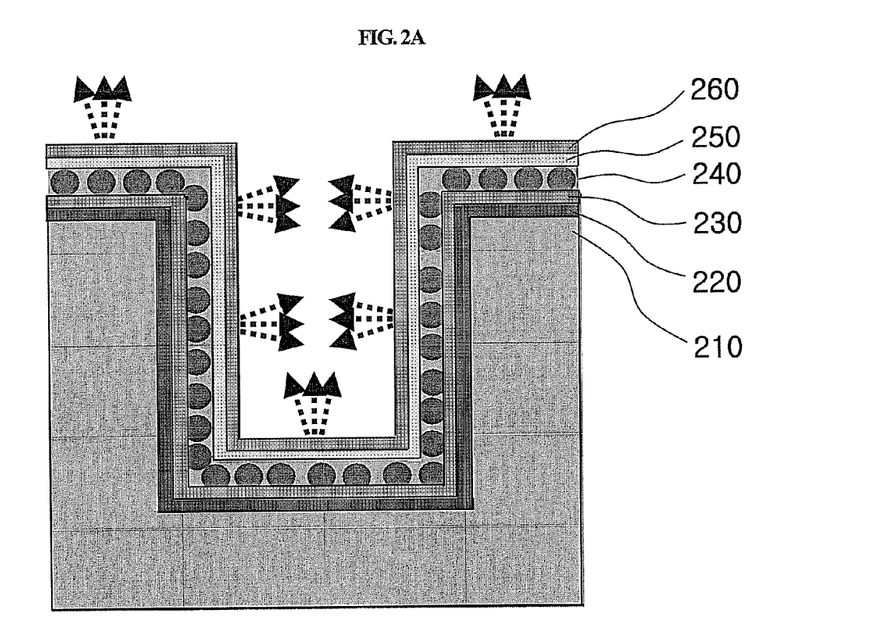
FIGS. 2a and 2b are schematic cross-sectional views of an exemplary three-dimensional light emitting device according to an embodiment.
Figure 2B:
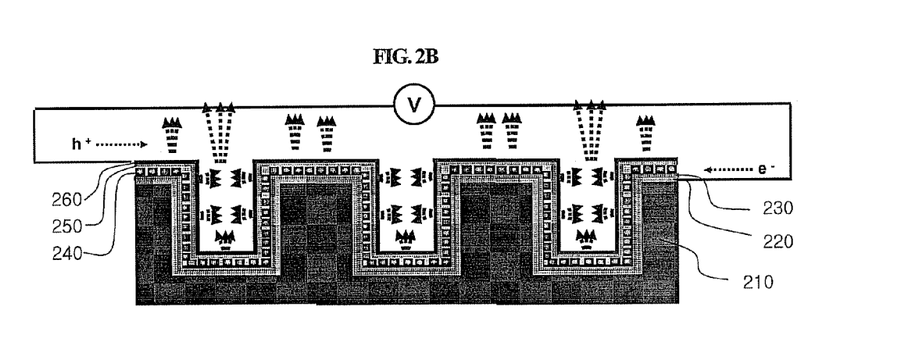

FIGS. 2a and 2b are schematic cross-sectional views of a three-dimensional light emitting device according to one embodiment. With reference to FIG. 2a, the light emitting device according to an embodiment comprises a first electrode 220, an electron transport layer 230, a semiconductor nanoparticle layer 240, a hole transport layer 250 and a second electrode 260 formed in this order on a patterned substrate 210. To provide low power consumption, stable driving and improved luminescence efficiency, the light emitting device using semiconductor nanoparticles may further comprise a hole blocking layer (not shown) for restricting the migration of holes from the semiconductor nanoparticle layer or an electron blocking layer for restricting the migration of electrons from the semiconductor nanoparticle layer. A suitable material for the blocking layers, can include a phenanthrene derivative, a triazole derivative, or the like, or a combination comprising at least one of the foregoing materials.

As shown in FIG. 2b, when a voltage is applied to the electrodes of the light emitting device, the first electrode 220 injects electrons into the electron transport layer 230 while the second electrode 260 injects holes (i.e., positively charged carriers) into the hole transport layer 250. The injected holes and electrons migrate toward the oppositely charged electrodes. The holes combine with the electrons in the semiconductor nanoparticle layer 240 to create excitons, and then the excitons subsequently recombine to emit light.

As the substrate of the light emitting device according to the present invention, a general substrate material can be used such as, for example, glass, ITO-coated glass, quartz, a silicon (Si) wafer, a silica-coated substrate, or an alumina-coated substrate. The substrate material can be processed into a plate, sheet or film shape. Examples of substrate materials that can be used include, but are not limited to: glass materials, such as glass, barium silicate glass, and aluminosilicate glass; plastics, such as polyesters, polycarbonates, polysulfones, polymethylmethacrylates, polypropylenes, and polyethylenes; quartz; and ceramics, such as clay.

Materials for the first electrode 220 are not particularly restricted, and examples thereof include low work function metals, such as, e.g., Li, Cs, Ba, Ca, Ca/Al, LiF/Ca, LiF/Al, $BaF_2$/Ca, Mg, Ag, Al, and alloys comprising at least one of the foregoing metals.

The electron transport layer 230 may be a molecular matrix. Examples of such molecular matrices may include metal composites, such as a metal composite of 8-hydroxyquinoline. The metal composite of 8-hydroxyquinoline may be an aluminum, gallium, indium, zinc, or magnesium complex of 8-hydroxyquinoline. In an exemplary embodiment, the metal composite is aluminum tris(8-hydroxyquinoline) ("Alq3").

Other materials for the electron transport layer 230 may include, for example, metal thioxinoid compounds, oxadiazole metal chelates, triazoles, sexithiophene derivatives, pyrazines, styrylanthracene derivatives, or a combination comprising at least one of the foregoing materials.

The semiconductor nanoparticle layer 240 of the light emitting device according to the present invention may be formed into a monolayer or multilayer structure. The semiconductor nanoparticle layer 240 can be formed using semiconductor nanocrystals, quantum dots, or the like, instead of semiconductor nanoparticles.

Semiconductors constituting the semiconductor nanoparticles can be selected from the group consisting of compound semiconductors, such as Group II-VI compounds, Group II-V compounds, Group III-VI compounds, Group III-V compounds, Group IV-VI compounds, Group I-III-VI compounds, Group II-IV-VI compounds and Group II-IV-V compounds, metals, and magnetic particles. As disclosed herein, such compounds include a combination of elements from two or more groups from the periodic chart. For example, a Group II-VI compound means a compound that includes an element of Group II and an element of Group VI. In an exemplary embodiment, semiconductor nanoparticles include CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, FePt, $Fe_2O_3$, $Fe_3O_4$, Si, Ge, or a combination comprising at least one of the foregoing nanoparticles, but are not limited to these nanoparticles.

The semiconductor nanoparticles constituting the semiconductor nanoparticle layer of the light emitting device may have a core-shell structure in which an overcoating is formed on the surface of a core. The overcoating may be made of a semiconductor material having a composition different from that of the core. Examples of suitable materials for the overcoating include Group II-VI compounds, Group II-V compounds, Group III-VI compounds, Group III-V compounds, Group IV-VI compounds, Group I-III-VI compounds, Group II-IV-VI compounds, and Group II-IV-V compounds, or a combination comprising at least one of the foregoing materials. Specific examples of materials for the overcoating include ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or a combination comprising at least one of the foregoing materials.

Materials for the hole transport layer 250 are not specially limited, examples of which include poly(3,4-ethylenedioxythiophene)/polystyrene ("PEDOT/PSS") derivatives, poly-N-vinylcarbazole derivatives, polyphenylenevinylene derivatives, polyparaphenylene derivatives, polymethacrylate derivatives, poly(9,9-octylfluorene) derivatives, poly(spirofluorene) derivatives, N,N'-diphenyl-N,N'-bis(3-methylphenyl)-(1,1'-biphenyl)-4,4'-diamine ("TPD"), N,N'-di(naphthalen-1-yl)-N-N'-diphenyl-benzidine ("NPB"), tris(3-methylphenylphenylamino)-triphenylamine ("m-MTDATA"), and poly(9,9'-dioctylfluorene-co-N-(4-butylphenyl)diphenylamine ("TFB") or a combination comprising at least one of the foregoing.

The electron transport layer 230 and the hole transport layer 250 can be contacted to the surfaces of the first and second electrodes, respectively, by spin coating, dip coating, deposition, and other thin film deposition processes. The electrodes, the electron transport layer, and the hole transport layer are laminated along the three-dimensional recesses of the substrate so that the final light emitting device has a three-dimensional recessed structure.

Materials for the second electrode 260 are not particularly limited. The second electrode 260 is made of an electrically conductive metal or its oxide through which holes are easily injected. Specific examples of materials for the second electrode include indium tin oxide ("ITO"), indium zinc oxide ("IZO"), nickel (Ni), platinum (Pt), gold (Au), and iridium (Ir).

Figure 3A:
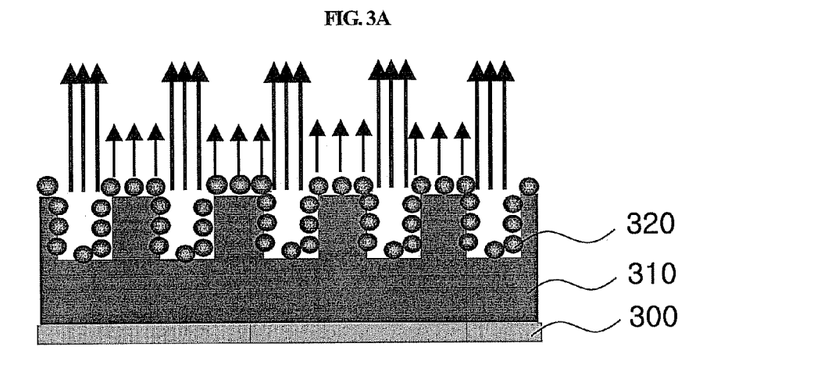
FIGS. 3a and 3b are a schematic cross-sectional view and a top view of an exemplary three-dimensional light emitting device according to another embodiment, respectively.
Figure 3B:
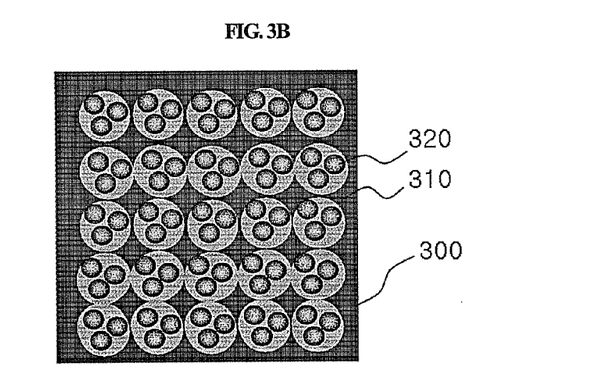

According to another embodiment, the light emitting device may be a photoluminescence device. The structure of a photoluminescence device according to another embodiment of the present invention is shown in FIGS. 3a and 3b. Specifically, FIGS. 3a and 3b are a schematic cross-sectional view and a top view of the photoluminescence device, respectively. As shown in FIG. 3a, the photoluminescence device comprises a transparent substrate 310, such as for example a glass substrate, and a semiconductor nanoparticle layer 320 sequentially formed on a light source 300.

The substrate 310 of the photoluminescence device is provided with a plurality of three-dimensional recesses. The semiconductor nanoparticle layer 320 is formed along the three-dimensional recesses of the substrate. The arrows shown in FIG. 3a indicate relative amounts of light emitted from the semiconductor nanoparticle layer. As shown in FIG. 3a, since semiconductor nanoparticles are formed on the entire surface of the recessed substrate, the light emitting area of the semiconductor nanoparticle layer is increased. In addition, amplification resulting from resonance occurs within the recesses depending on the type of the light source so that the luminescence intensity is enhanced, leading to an increase in the amount of light emitted from the recesses. Referring to FIG. 3b, as viewed from the top of the photoluminescence device, the semiconductor nanoparticle layer 320 is formed on the entire surface of the bottoms and side walls of the recessed substrate 310.

As the light source 300 of the photoluminescence device shown in FIG. 3a (not seen in FIG. 3b), various light sources can be used such as for example visible light and UV light sources. The type of the light source can be optimally selected according to the kind of semiconductor nanoparticles constituting the semiconductor nanoparticle layer.

Also in FIGS. 3a and 3b, substrate 310 can be glass, ITO-coated glass, quartz, a silicon (Si) wafer, a silica-coated substrate, or an alumina-coated substrate. The semiconductor nanoparticle layer may be formed into a monolayer or multilayer structure. The semiconductor nanoparticle layer can be formed using semiconductor nanocrystals, quantum dots, or the like, instead of semiconductor nanoparticles.

The three-dimensional recesses used in the photoluminescence device increase the amount of light emitted from the photoluminescence device, and thus the recessed structure can be applied to the fabrication of light emitting diodes (LEDs). That is, a UV LED is positioned under the substrate provided with three-dimensional recesses, on which semiconductor nanoparticles are formed, to fabricate a light emitting diode (LED). The light emitting diode (LED) thus fabricated has a structure in which the semiconductor nanoparticles emit visible light by irradiation of the UV LED.

The light emitting device has an advantage in that the amount of light emitted from the light emitting device is large per unit area. Therefore, the light emitting device finds particular use in a variety of displays, lasers, and luminescent-based diagnostic applications. For example, a flat panel display capable of displaying high-definition images can be manufactured by forming organic electroluminescence devices, as luminescent elements on a unit surface, in a matrix pattern on a planar substrate, and driving the organic electroluminescence devices in a dot matrix type device.

Also provided is a method for fabricating a three-dimensional light emitting device. The method will be explained below.

A light emitting device is fabricated by the following procedure. First, a dispersion of semiconductor nanoparticles whose surface is modified to be charged is prepared. Three-dimensional recesses are formed in a substrate, and then the substrate is pretreated so as to be charged oppositely to the surface of the semiconductor nanoparticles. Thereafter, the pretreated substrate is coated with the dispersion of the semiconductor nanoparticles to form a semiconductor nanoparticle layer thereon. The semiconductor nanoparticle layer is formed along the three-dimensional recesses of the substrate so that the semiconductor nanoparticle layer has a recessed structure. For example, when it is intended to fabricate an organic electroluminescence device, a first electrode, an electron transport layer in electrical contact with the first electrode, a semiconductor nanoparticle layer on a surface of the electron transport layer, a hole transport layer on a surface of the semiconductor nanoparticle layer opposite the electron transport layer, and a second electrode on and in electrical contact with the hole transport layer are sequentially formed along the three-dimensional recesses of the substrate. As a result, the final organic electroluminescence device has a three-dimensionally recessed structure, like the semiconductor nanoparticle layer.

A more detailed explanation of the respective steps of the method will be provided below.

a) Formation of Three-Dimensional Recesses in Substrate

Processes for forming three-dimensional recesses in a substrate are not particularly limited. Exemplary processes for forming the recesses include patterning by photolithography followed by physical etching, chemical etching, and electrochemical etching.

Figure 4:
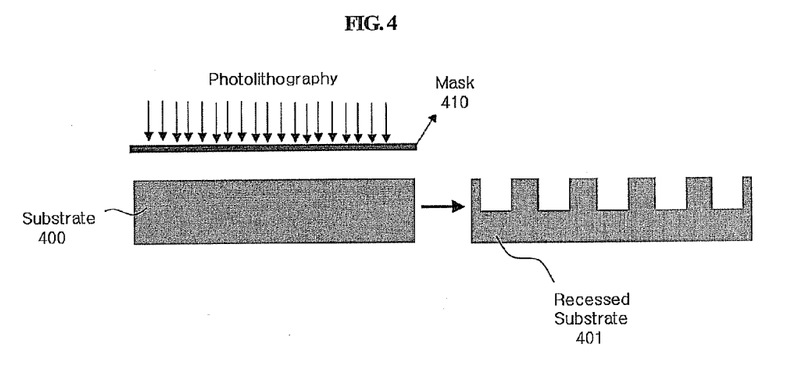
FIG. 4 is a schematic diagram illustrating the formation of a substrate provided with three-dimensional recesses.

FIG. 4 illustrates the formation of recesses in a substrate by photolithography. As shown in FIG. 4, the substrate 400 can be patterned with recesses by photolithography, using a mask 410 to provide various patterns in a photoimageable layer (e.g., a photoresist or inorganic patternable layer), such as square lattice patterns and circular lattice patterns. The size of the recesses can be controlled by varying the size of the mask during photolithography. The pattern is then transferred to the substrate using an etch process. The depth of the recesses can be controlled by varying chemical, electrochemical, or physical etching time and intensity. The same principle is applied to the formation of recesses having other structures, such as polygonal pillars, cylinders, and tubes.

b) Surface Modification of Semiconductor Nanoparticles

The surface of the semiconductor nanoparticles is modified under mild reaction conditions with a surface modifying agent so that the surface is charged. Then, the surface-charged semiconductor nanoparticles are dried under vacuum to remove the remaining solvent. The dried nanoparticles are dispersed in an aqueous solution, and centrifuged to remove unreacted remnants and impurities.

Specific examples of charged materials that can be used to modify the surface of the semiconductor nanoparticles include, but are not limited to, mercaptoacetic acid ("MAA"), 3-mercaptopropionic acid, cysteamine, aminoethanethiol, N,N-dimethyl-2-mercaptoethyl ammonium, tetramethylammonium hydroxide ("TMAH"), glutamic acid, glutaric acid, glutamine, L-lysine monohydrochloride, lysine, or a combination comprising at least one of the foregoing charged materials.

After the surface modification of the semiconductor nanoparticles is complete, unreacted remnants and impurities are removed from the solution of the semiconductor nanoparticles. To remove the impurities, the solution of the semiconductor nanoparticles is washed by repeated precipitation followed by centrifugation. Specifically, the washing is achieved by repeating dispersion of the semiconductor nanoparticles in an organic solvent, and precipitation. For sufficient washing, it is preferred to repeat dispersion and precipitation from three to ten times.

After completion of the washing, the washed semiconductor nanoparticles are dried under vacuum to remove the remaining solvent. For sufficient removal of the remaining solvents, drying is performed under vacuum for 1-12 hours.

Subsequently, the dried semiconductor nanoparticles are dispersed in a solvent, such as water or aqueous Tris (i.e., tris (hydroxymethylamino) methane) buffer. The dispersion is can be centrifuged at a g-force of 4,000-50,000 g for one minute to three hours, specifically at 4,000-30,000 g for one minute to one hour to selectively precipitate agglomerates of the semiconductor nanoparticles from the nanoparticles dispersed in the dispersion.

c) Pretreatment of the Substrate so that the Substrate is Charged Oppositely to the Surface of the Semiconductor Nanoparticles The substrate is pretreated to modify the surface of the substrate. This surface modification allows the substrate to have a charge opposite to that of the surface of the semiconductor nanoparticles. The pretreatment of the substrate is performed by washing the substrate and reacting the washed substrate with an aminosilane or carboxysilane to form amine or carboxyl groups on the substrate surface.

More specifically, the pretreatment of the substrate is performed by washing the substrate with a piranha solution (e.g., $H_2SO_4/30$ wt % aq. $H_2O_2=1:3$ (v/v)) or an RCA solution (e.g., $NH_4OH/H_2O_2/H_2O=1:1:5$ (v/v)), sequentially, and dispensing a reaction solution, e.g., an aminosilane/toluene solution, containing functional groups to be adsorbed onto the washed substrate.

By use of the term "functional groups to be adsorbed" herein is meant all functional groups that allow the substrate surface to be charged oppositely to the surface of the semiconductor nanoparticles. Such charged materials can be selected from the group consisting of 3-aminopropylmethyldiethoxysilane (APS), mercaptoacetic acid (MAA), 3-mercaptopropionic acid, cysteamine, aminoethanethiol, N,N-dimethyl-2-mercaptoethyl ammonium, tetramethylammonium hydroxide (TMAH), glutamic acid, glutaric acid, glutamine, L-lysine monohydrochloride, and lysine, but are not limited to these materials. In an exemplary embodiment, the substrate is dipped at ambient pressure, under vacuum, or under pressure.

The introduction of the reaction solution onto the substrate permits the functional groups to be adsorbed on the substrate surface by physical adsorption and chemical reaction between the functional groups and the substrate.

After the modification of the substrate is finished, the remaining solvent is removed. Then, the substrate is washed and dried, completing the pretreatment of the substrate.

Although the pretreatment of the substrate surface by a wet process, such as dipping, has been described herein, other processes, such as for example e-beam treatment, ion beam treatment, and treatment using atomic force microscopy ("AFM"), can be employed to form a charge on the substrate surface.

d) Coating the Pretreated Substrate with the Dispersion of the Semiconductor Nanoparticles The pretreated substrate is coated with the semiconductor nanoparticles using the dispersion of the semiconductor nanoparticles. The pretreated substrate can be coated by wet coating processes, including drop casting, spin coating, dip coating, spray coating, flow coating, screen printing and ink-jet printing. In an exemplary embodiment, the coating is conducted at ambient pressure, under vacuum or pressure by a wet coating process to uniformly coat the semiconductor nanoparticle dispersion on the surface of the three-dimensional recessed substrate.

Since the semiconductor nanoparticle dispersion introduced to the substrate allows the substrate surface to have a charge opposite that of the surface of the semiconductor nanoparticles, the semiconductor nanoparticles are adsorbed onto the substrate surface by electrostatic attraction.

Thereafter, it is desirable to perform solvent extraction of the nanoparticle-coated surface under vacuum, pressure, or centrifugal force to sufficiently remove the remaining solvent containing impurities.

After completion of the solvent extraction, the resulting substrate is washed by an appropriate process, e.g., spin washing, and dried under vacuum, to complete coating of the semiconductor nanoparticles.

Thereafter, an electroluminescence device is fabricated by forming electrodes, an electron transport layer and a hole transport layer on the semiconductor nanoparticle layer in the same manner as in the fabrication of conventional organic light emitting devices.

Hereinafter, the present invention will be explained in more detail with reference to the following examples. However, these examples are given for the purpose of illustration and are not intended to limit the present invention.

EXAMPLE 1

A solution of 1.8424 g of mercaptoacetic acid (MAA) in 8 ml of chloroform was heated to 70° C., and then 3 ml of CdSe semiconductor nanoparticles present at a concentration of 20 mg nanoparticles per ml in toluene (mean nanoparticle diameter 6 nm, available from Evident tech.) were added to the solution with vigorous stirring. Subsequently, the mixture was allowed to react at reflux (70° C.) with stirring for 3 hours. After the reaction was completed, the reaction solution was centrifuged at 3,000 rpm to obtain a precipitate. The precipitate was dispersed in chloroform. The dispersion was again centrifuged at 3,000 rpm for 5 minutes to obtain a precipitate. A cycle of precipitation and dispersion was repeated seven times. The washed semiconductor nanoparticles were dried under vacuum for 6 hours and dispersed in a 0.1 M Tris buffer (pH=9). The dispersion was centrifuged at a g-force of 15,000 g for 10 minutes to remove agglomerates of the semiconductor nanoparticles, and as a result, a dispersion of the semiconductor nanoparticles was obtained.

A silicon wafer substrate having recessed regions (having a recess dimension of 3 μm×3 μm×0.8 μm) was dipped in a piranha solution ($H_2SO_4/H_2O_2=1:3$ (v/v)), heated for 15 minutes, and washed with plenty of water. The washed substrate was subjected to sonication using an RCA solution ($NH_4OH/H_2O_2/H_2O=1:1:5$ (v/v)) at 70° C. for one hour, followed by sonication using methanol. Subsequently, the resulting substrate was dipped in an aminosilane (5 vol %) solution in toluene at ambient pressure for five hours to allow the amine groups to adsorb to the substrate. The amine group-adsorbed substrate was spun at 3,000 rpm for 5 seconds to remove the reaction solution by centrifugal force. The resulting substrate was dipped in deionized water for 5 seconds and washed by spinning at 3,000 rpm. The washed substrate was immersed and stored in an HCl solution (pH=1).

Next, the substrate was dip-coated with the semiconductor nanoparticle dispersion in a vacuum chamber under a pressure of $2.3 \times 10^{-3}$ torr for one hour, followed by spinning at 3,000 rpm for 5 seconds to remove the semiconductor nanoparticle solution. The resulting substrate was dipped in deionized water for 5 seconds, washed by spinning at 3,000 rpm to form a semiconductor nanoparticle layer on the amine-treated surface.

EXPERIMENTAL EXAMPLE 1

Observation of Surface of Light Emitting Device

Figure 5:
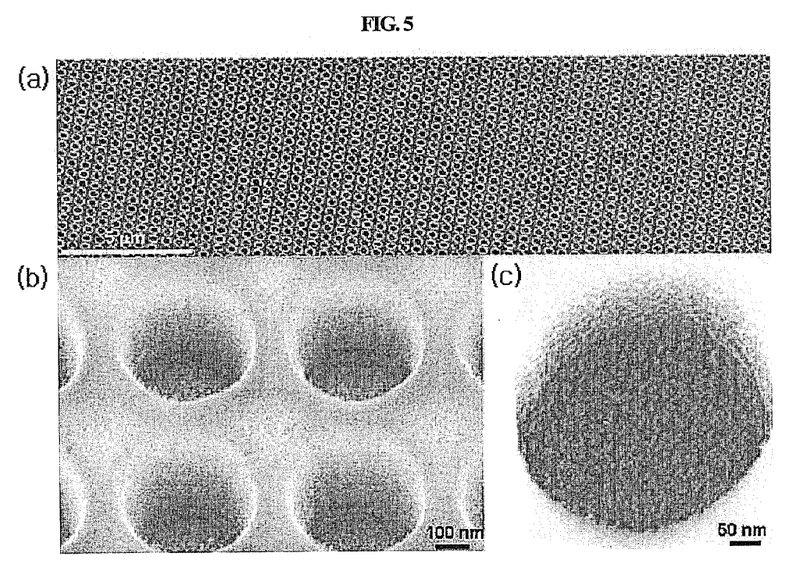
FIGS. 5a through 5c are scanning electron micrographs ("SEMs") of an exemplary three-dimensional light emitting device according to an embodiment.

FIG. 5a is a scanning electron micrograph (SEM) of a light emitting device in which a semiconductor nanoparticle layer is formed on the three-dimensional silicon substrate prepared in Example 1. FIG. 5b is an enlarged partial view of FIG. 5a which shows patterned recesses. FIG. 5c is an enlarged partial view of one recess shown in FIG. 5b. The images of FIGS. 5a to 5c reveal that the semiconductor nanoparticles are uniformly adsorbed on the surface of the substrate as well as the inner side walls and bottoms of the recesses. Referring to FIG. 5a, a plurality of the recesses are regularly spaced in the substrate and are formed in a circular lattice pattern.

EXPERIMENTAL EXAMPLE 2

Measurement of Amount of Light Emitted from Light Emitting Device

Figure 6A:
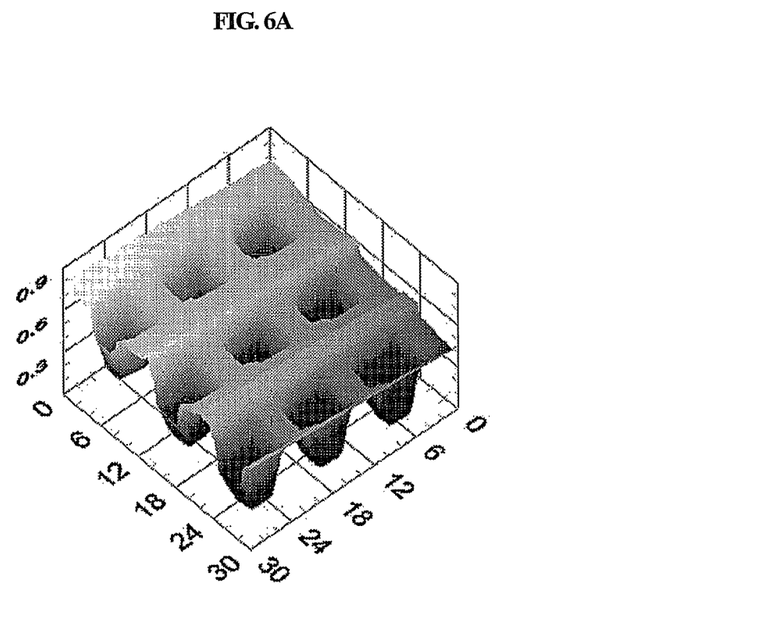
FIG. 6a shows the topography of an exemplary substrate used in Example 1, as observed by near-field scanning optical microscopy (NSOM)

The amount of light emitted from the light emitting device fabricated in Example 1 was measured by near-field scanning optical microscopy ("NSOM"). The topography of the substrate prepared in Example 1 was obtained by NSOM, and is shown in FIG. 6a. As can be seen from the topography shown in FIG. 6a, a plurality of three-dimensional recesses are regularly spaced and are included in the substrate.

Figure 6B:
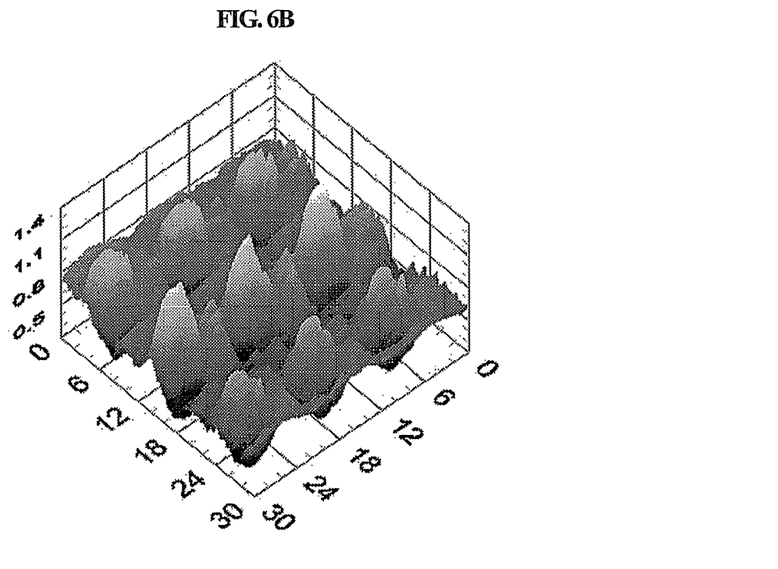
FIG. 6b shows the results of near-field scanning optical microscopy ("NSOM") for a three-dimensional light emitting device fabricated in Example 1.

The light emitting device comprising the semiconductor nanoparticle layer formed on the substrate provided with three-dimensional recesses while maintaining the recessed structure of the substrate was measured for photon intensity by near-field scanning optical microscopy (NSOM). The results are shown in FIG. 6b. Referring to FIG. 6b, as can be seen in the NSOM data, the recesses of the substrate emitted a much larger amount of light than the flat surface of the substrate. The light emitting device prepared according to Example 1 was even brighter when visually observed. This observation suggests that the light emitting device can be effectively used as a high-luminance light emitting device.

Although the present invention has been described herein with reference to the foregoing specific examples, these examples are intended to illustrate and should not be considered as limiting the scope of the present invention. Accordingly, those skilled in the art will appreciate that various modifications and changes are possible, without departing from the technical spirit of the present invention.

As apparent from the above description, since the three-dimensional light emitting device comprises a semiconductor nanoparticle layer, it has an increased light emitting area and an enhanced luminescence intensity per unit area, thus achieving improved luminescence efficiency. Therefore, the use of the three-dimensional light emitting device according to the present invention enables the manufacture of small and thin display devices.

What is claimed is:

1. A light emitting device comprising a substrate and a semiconductor nanoparticle layer, wherein the substrate is provided with a plurality of three-dimensional recesses and semiconductor nanoparticles are arranged on a surface of the plurality of three-dimensional recesses, and wherein the semiconductor nanoparticle layer comprises a plurality of three-dimensional recesses which correspond to the three-dimensional recesses of the substrate.

2. The light emitting device according to claim 1, wherein the recesses have a sectional shape selected from the group consisting of squares, triangles, polygons, circles, ellipsoids, and a combination comprising at least one of the foregoing shapes.

3. The light emitting device according to claim 1, wherein the semiconductor nanoparticle layer is a monolayer or multilayer structure of the semiconductor nanoparticles.

4. The light emitting device according to claim 1, wherein the light emitting device is an electroluminescence device or a photoluminescence device.

5. The light emitting device according to claim 4, wherein the electroluminescence device comprises a first electrode, an electron transport layer in electrical contact with the first electrode, the semiconductor nanoparticle layer on a surface of the electron transport layer, a hole transport layer on a surface of the semiconductor nanoparticle layer, and a second electrode on a surface of and in electrical contact with the hole transport layer, wherein the layers are sequentially laminated on the substrate provided with a plurality of recesses while maintaining the recessed structure of the substrate.

6. The light emitting device according to claim 1, further comprising a hole blocking layer or an electron blocking layer.

7. The light emitting device according to claim 4, wherein the photoluminescence device comprises the substrate provided with a plurality of recesses and the semiconductor nanoparticle layer formed on a light source, and the semiconductor nanoparticle layer is formed on the substrate while maintaining the recessed structure of the substrate.

8. The light emitting device according to claim 1, wherein the semiconductor nanoparticles are selected from the group consisting of nanoparticles of Group II-VI compounds, Group II-V compounds, Group III-VI compounds, Group III-V compounds, Group IV-VI compounds, Group I-III-VI compounds, Group II-IV-VI compounds, and Group II-IV-V compounds.

9. The light emitting device according to claim 8, wherein the semiconductor nanoparticles comprise CdS, CdSe, CdTe, ZnS, ZnSe, ZnTe, GaN, GaP, GaAs, GaSb, AN, AlP, AlAs, AlSb, InP, InAs, InSb, SiC, Fe, Pt, Ni, Co, Al, Ag, Au, Cu, FePt, $Fe_2O_3$, $Fe_3O_4$, Si, Ge, and a combination comprising at least one of the foregoing nanoparticles.

10. The light emitting device according to claim 9, wherein the semiconductor nanoparticles have a core-shell structure consisting of a core and an overcoating formed on the core, and the overcoating is made of at least one material comprising ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, and a combination comprising at least one of the foregoing materials.

11. The light emitting device according to claim 5, wherein the substrate is selected from the group consisting of glass, ITO glass, quartz, silicon (Si) wafers, silica-coated substrates, and alumina-coated substrates.

12. A display comprising the light emitting device according to claim 1.

13. A light emitting device according to claim 1, wherein the semiconductor nanoparticle layer is provided with a plurality of three-dimensional recesses.

* * * * *